(12) United States Patent
Jensen et al.

(10) Patent No.: US 7,763,414 B2
(45) Date of Patent: Jul. 27, 2010

(54) PSEUDO LOW VOLUME RETICLE (PLVR) DESIGN FOR ASIC MANUFACTURING

(75) Inventors: John Jensen, Portland, OR (US); Robert Muller, Portland, OR (US)

(73) Assignee: LSI Corporation, Milpitas, CA (US)

( * ) Notice: Subject to any disclaimer, the term of this patent is extended or adjusted under 35 U.S.C. 154(b) by 49 days.

(21) Appl. No.: 12/204,290

(22) Filed: Sep. 4, 2008

(65) Prior Publication Data

US 2009/0034830 A1 Feb. 5, 2009

Related U.S. Application Data

(62) Division of application No. 10/944,995, filed on Sep. 20, 2004, now abandoned.

(51) Int. Cl.
G03C 5/00 (2006.01)
G03F 1/00 (2006.01)

(52) U.S. Cl. .......................................... 430/311; 430/5

(58) Field of Classification Search ................. 430/311, 430/312, 313, 394; 355/53, 72
See application file for complete search history.

(56) References Cited

U.S. PATENT DOCUMENTS

| 5,604,059 | A | 2/1997 | Imura et al. |
| 6,194,105 | B1 * | 2/2001 | Shacham et al. ............... 430/5 |
| 6,444,374 | B1 | 9/2002 | Shimazu et al. |
| 6,552,790 | B1 | 4/2003 | Templeton et al. |
| 7,435,533 | B2 * | 10/2008 | Rockwell et al. ............ 430/311 |
| 2005/0112474 | A1 | 5/2005 | Sandstrom |
| 2005/0277032 | A1 | 12/2005 | Rockwell et al. |

* cited by examiner

*Primary Examiner*—Stephen Rosasco
(74) *Attorney, Agent, or Firm*—Trexler, Bushnell, Giangiorgi, Blackstone & Marr, Ltd.

(57) ABSTRACT

A Pseudo Low Volume Reticle (PLVR) which consists of multiple design layers on a single reticle. Specifically, the reticle can include two instances of each layer in order to facilitate die-to-die inspection techniques. A scribe is wrapped around each instance of the layer, such that both the frame and active area of the chip can be inspected with the die-to-die method. The chip consists of design data for a given part. The scribe, or frame, is preferably standard data across products which is used for yield and in line testing during the chip manufacturing process. Since only one chip and scribe unit is necessary to manufacture a device at each layer, it is only necessary that one chip and scribe instance yield during the reticle manufacturing process.

10 Claims, 8 Drawing Sheets

PSEUDO LOW VOLUME RETICLE (PLVR) DESIGN FOR ASIC MANUFACTURING

RELATED APPLICATION (PRIORITY CLAIM)

This application is a divisional of U.S. patent application Ser. No. 10/944,995, filed Sep. 20, 2004, which is hereby incorporated herein by reference in its entirety.

BACKGROUND

The present invention generally relates to reticle technology, photolithography, and ASIC manufacturing, and more specifically relates to a Pseudo Low Volume Reticle (PLVR) design for ASIC manufacturing.

A number of problems have been identified in the fields of reticle technology, photolithography and ASIC manufacturing, including: the high cost of a high volume reticle (HVR) mask set due to the total number of masks needed for a device; the inability to inspect the scribe region of an HVR set by die-to-die inspection techniques; the high cost of defect inspection on Low Volume Reticles (LVRs) due to die-to-database restrictions; the need for LVRs to be compatible with a die-to-die defect inspection tool; the long overhead time for data preparation time in die-to-database inspection; the long overhead time associated with disposition of false defects from die-to-database inspections; the increase potential of mask shop re-write due to non yielding single die LVR reticles; the need for fast prototype turnaround time (TAT) associated with the first mask of an LVR reticle set; and the inability to perform in-line inspections of LVR reticles on a die-to-die inspection tool.

One existing approach includes using HVR reticles which are die-to-die compatible. In conventional HVR manufacturing, there exists one reticle for each layer of a device. Data for each layer is arrayed on each reticle to maximize the instances of die exposed per shot. While multiple instances of the die on the reticle allow for die-to-die inspection, the X and Y scribe are excluded from inspection due to a lack of reference structure. Additionally, this method is lacking for small scale ASIC production since mask sets with many layers are relatively expensive for low volume customer orders.

Figure 1:
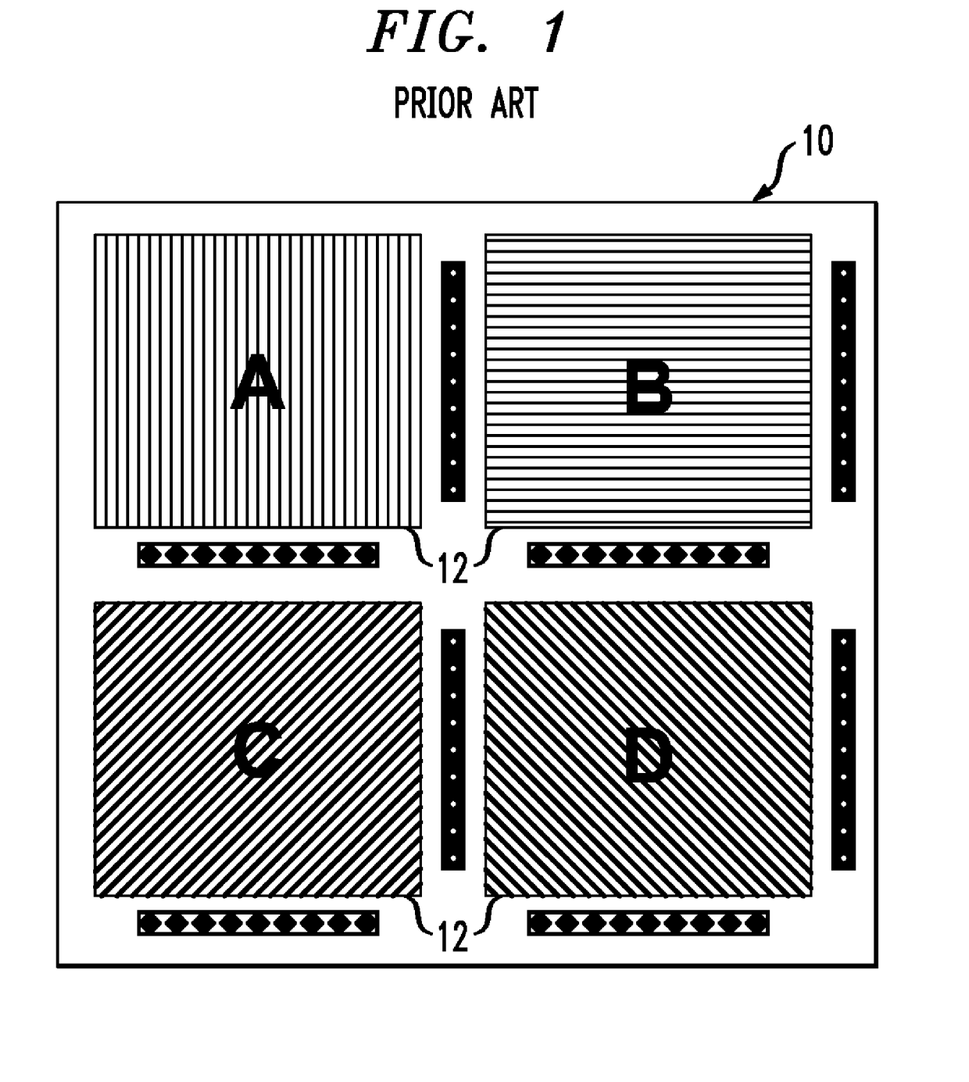
FIG. 1 illustrates a conventional LVR reticle with multiple layers denoted by A, B, C and D.
Figure 2:
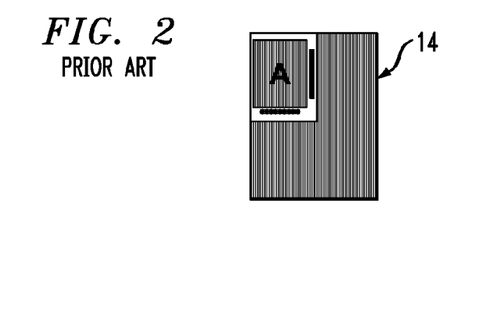
FIG. 2 shows a stepper file blading off all but the first region (i.e., region A) of the reticle.
Figure 3:
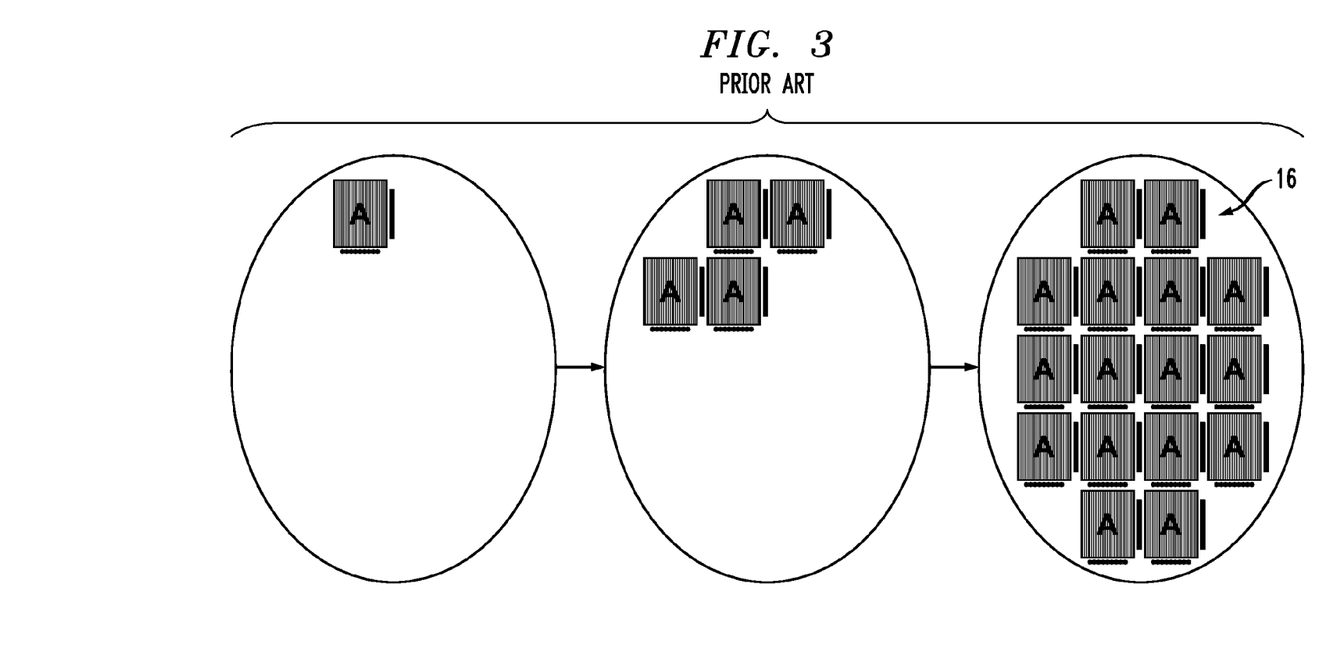
FIG. 3 illustrates the first region (i.e., region A) being printed over and over again to produce an entire layer of the device.
Figure 4:
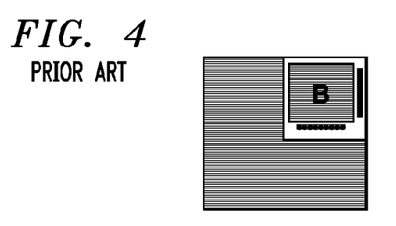
FIG. 4 shows the stepper file blading off all but the second region (i.e., region B) of the reticle.
Figure 5:
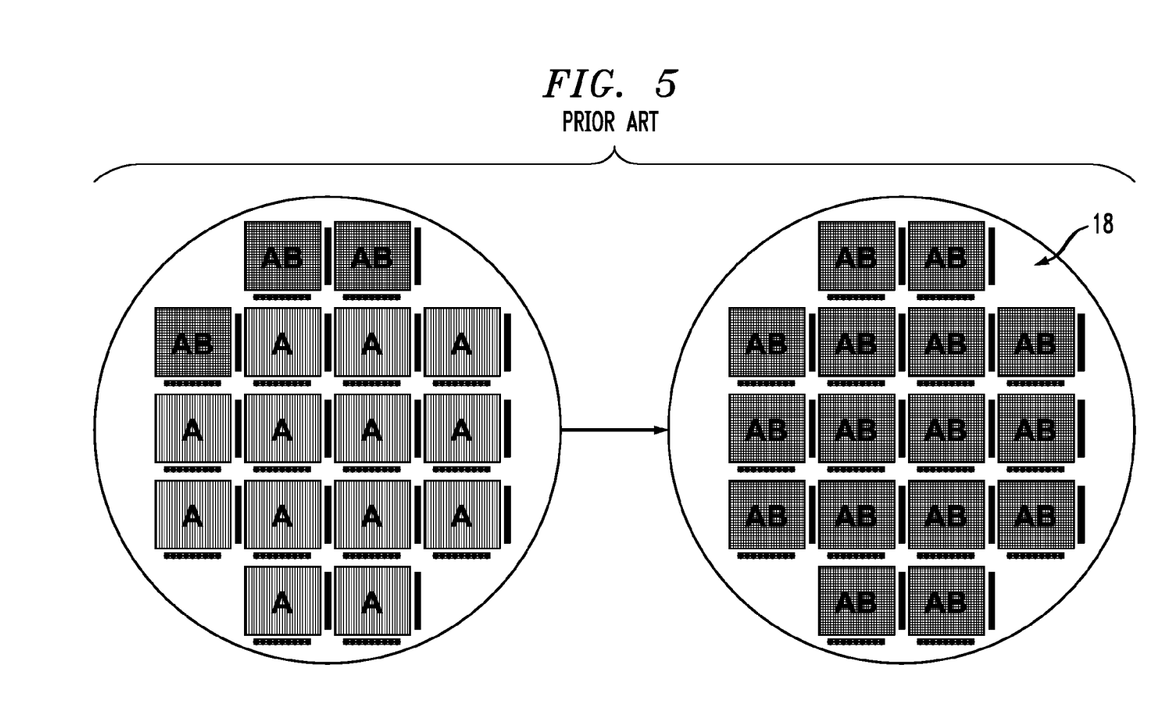
FIG. 5 illustrates the second region (i.e., region B) being printed over and over again to produce the next layer of the device.

Another existing approach includes using LVR reticles which require die-to-database inspection, but which minimize the total number of reticles in a set. In a conventional low volume reticle (LVR) approach, each reticle consists of multiple layers of a device on a single reticle in order to minimize the total number of reticles and hence reticle set cost. Only one layer region is exposed at a time such that a single reticle is used for several masking steps in the device manufacturing process. For example, FIG. 1 illustrates a reticle 10 which is consistent with a conventional LVR approach, wherein four different layers or regions 12 (i.e., region A, region B, region C, and region D) are included on one reticle. As shown in FIG. 2, rather than expose the whole reticle field, the stepper file 14 blades off all but one region (region A) of the reticle 10 and one layer 16 is printed at a time (see FIG. 3). The second region (region B) of the reticle (see FIG. 4) is then used to print the next layer 18 of the device (see FIG. 5).

Hence, a conventional LVR approach reduces reticle cost by minimizing the total number of reticles in a set. The cost of a reticle set is reduced from standard HVR production proportional to the decrease in total number of reticles to make a design. However, while a conventional LVR approach takes into account the number of reticles in a set, a conventional LVR approach doe not consider the cost implications associated with mandatory die-to-database reticle inspection, reticle yield, and wafer yield.

Figure 6:
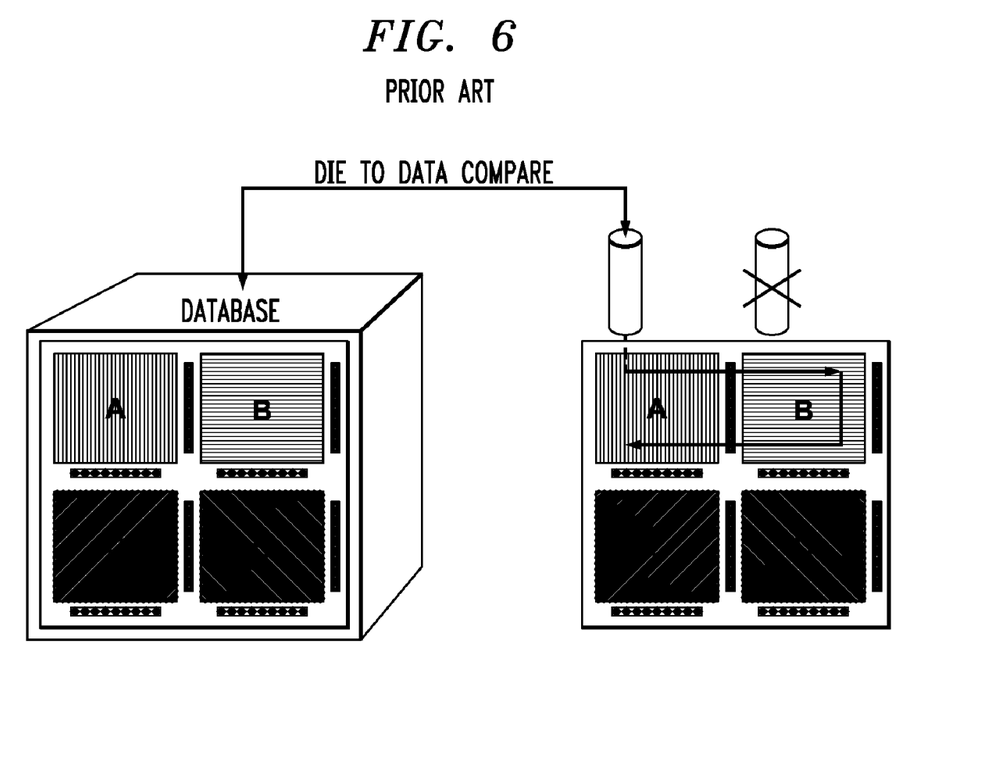
FIG. 6 illustrates why an LVR reticle cannot be inspected by die-to-die inspection methods.

LVR reticles are not die-to-die inspection compatible, a method which compared to die-to-database inspection, is less expensive, faster, and less prone to false defects. Specifically, since there are several layers rather than multiple instances of the same layer, there is no reference die for a die-to-die inspection. FIG. 6 illustrates why an LVR reticle cannot be inspected by die-to-die inspection methods. Since there is only one instance of each layer (i.e., one instance of each of layers A, B, C, and D), a reference for defect inspections must be provided from an outside data source.

Figure 7:
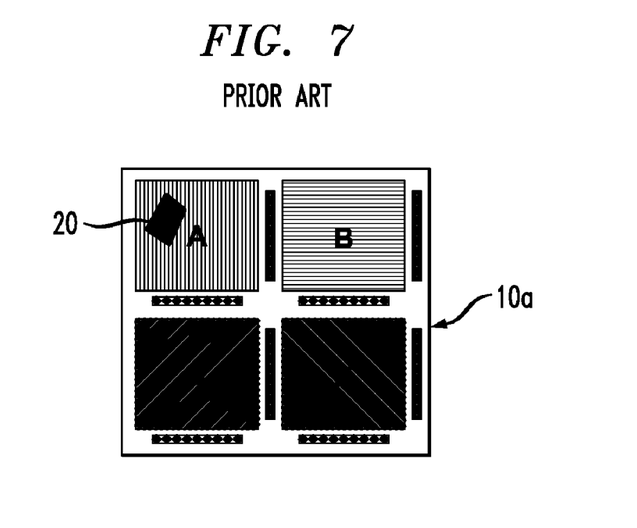
FIG. 7 illustrates a conventional LVR reticle having a defect in its first region (i.e., region A)
Figure 8:
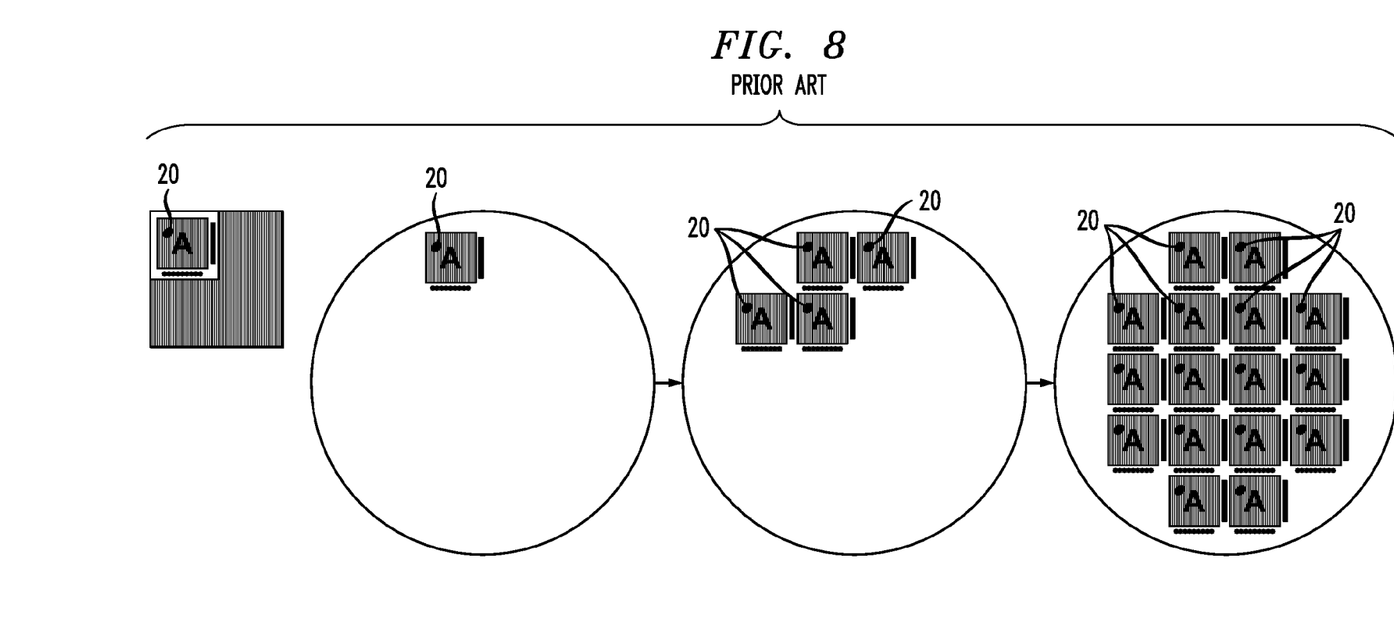
FIG. 8 illustrates how the defect impacts yield (i.e., 100% yield impact)

Moreover, since LVR reticles contain only one instance of each layer, reticle defects have a higher potential of causing mask and wafer yield fallout. Since a conventional LVR contains only one instance of each layer, a defect 20 on a single layer instance, such as shown in FIG. 7 (region A has the defect 20 in FIG. 7), can potentially make the reticle 10a unusable. Moreover, if the defect is added while in production use, all devices across the wafer could be rendered defective as illustrated in FIG. 8.

The fact that LVR reticles are not die-to-die inspectible and present a higher risk of mask and wafer yield fallout are both important considerations which affect both the mask manufacturing cost and cost of ownership of a reticle set.

OBJECTS AND SUMMARY

An object of an embodiment of the present invention is to provide a reticle design approach which provides that the reticle is compatible with die-to-die inspection methods.

Another object of an embodiment of the present invention is to provide an approach which addresses the loss of die per wafer and first pass reticle yield due to a single defect on a LVR reticle.

Yet another object of an embodiment of the present invention is to reduce the prototype turnaround time of wafer processing associated with full LVR reticle sets by increasing the potential of mask yield at the reticle manufacturer.

Still yet another object of an embodiment of the present invention is to provide a layout which enables die-to-die inspection of both chip and scribeline structures.

Briefly, and in accordance with at least one of the foregoing objects, an embodiment of the present invention provides a Pseudo Low Volume Reticle (PLVR) which consists of multiple design layers on a single reticle, wherein a plurality of instances of each of the layers is provided on a single reticle. For example, the reticle can include two instances of each layer in order to facilitate die-to-die inspection techniques. Preferably, a scribe is wrapped around each instance of each layer, such that both the frame and active area of the chip can be inspected with the die-to-die inspection method. The chip consists of design data for a given part. The scribe, or frame, is preferably standard data across products which is used for yield and in line testing during the chip manufacturing process. Since only one chip and scribe unit is necessary to manufacture a layer, it is only necessary that one chip and scribe instance yield during the reticle manufacturing process.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

Figure 9:
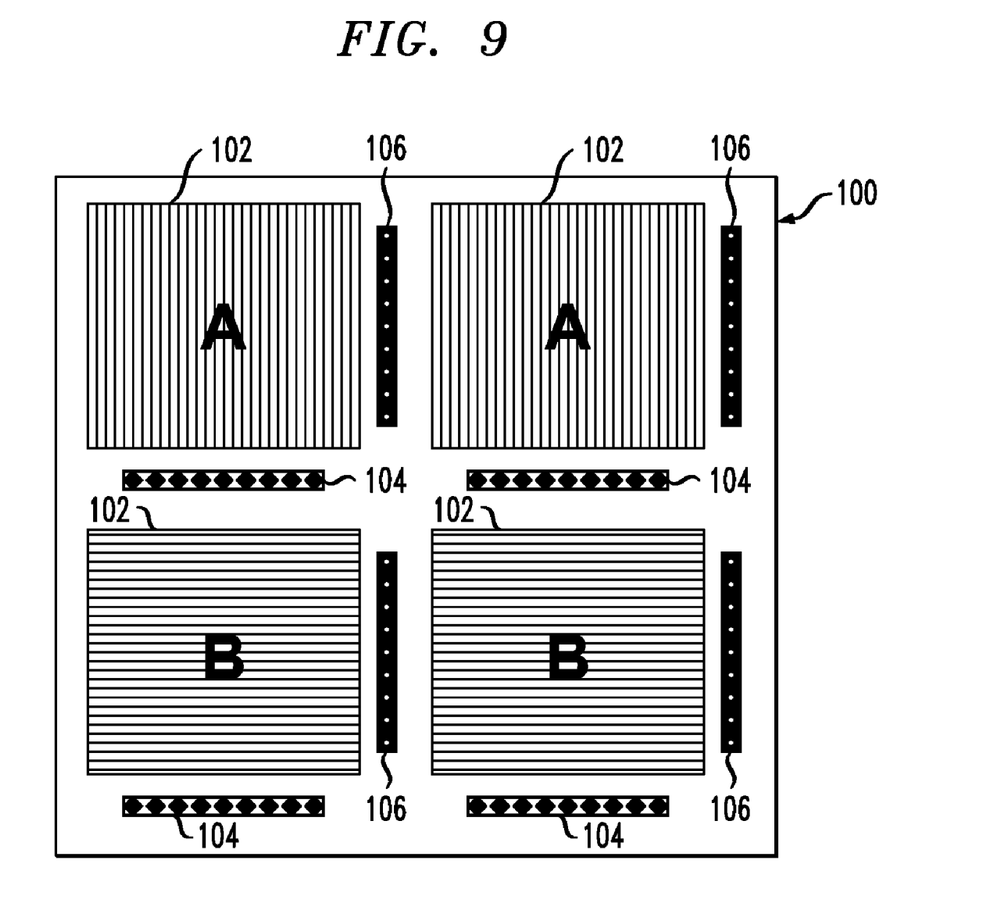
FIG. 9 illustrates a PLVR reticle which is in accordance with an embodiment of the present invention.

A specific embodiment of the present invention provides a Pseudo Low Volume Reticle (PLVR) 100 such as is illustrated in FIG. 9, wherein the reticle consists of multiple instances of multiple design layers or regions 102. Specifically, on a single reticle 100, there are a plurality of instances, such as two instances, of each layer in order to facilitate die-to-die inspection techniques. In FIG. 9, A and B represent two unique layers in chip design, and there are two instances of each region (i.e., two region A's, and two region B's).

Figure 10:
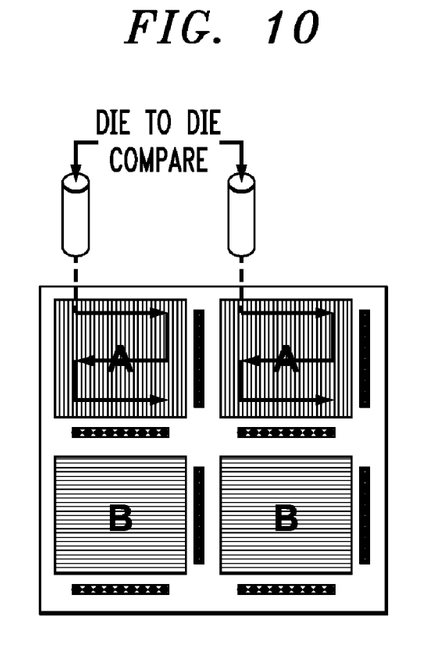
FIG. 10 illustrates how the PLVR reticle can be inspected by die-to-die inspection methods.

Preferably, a scribe (i.e., a horizontal or X scribe 104 and a vertical or Y scribe 106) is wrapped around each instance of each layer, such that both the frame and active area of the chip can be inspected with the die-to-die method, as indicated in FIG. 10. The chip consists of design data for the part. The scribe, or frame, (104 and 106) is preferably standard data across products which is used for yield and in line testing during the chip manufacturing process. Since only one chip and scribe instance is necessary for wafer device manufacturing, only one instance has to yield at the mask shop to facilitate device manufacturing. This increases mask shop yield by not having to reject a reticle which becomes defective in a single location during the manufacturing process. Increase in productivity and mask shop yield directly impacts reticle cost. Furthermore, if both layer instances yield at the mask shop then one can choose the superior die for production based off secondary considerations such as critical dimension (CD) uniformity or line edge roughness. Furthermore, if a die becomes defective while in production use, the other die may be used for production rather than purchasing a new reticle.

FIG. 10 illustrates how the reticle is die-to-die compatible due to there being two instances of each layer on the reticle (i.e., two region A's and two region B's). The second instance provides a reference chip for die-to-die inspection of the reticle. This design enables an inspection where one die is used as the reference to the other. Moreover, since both the scribe data and chip data are arrayed in a PLVR design, one can inspect the scribe by die-to-die methods as well. As a scribe is wrapped around each layer instance, both chip and scribe data can be inspected via die-to-die. Inspection of the scribe region is also a benefit with respect to HVR reticle design. Since multiple masking layers are on the same piece of glass, less reticles are needed for PLVR with respect to HVR. However, it should be noted that for each LVR reticle, the equivalent masking layers would need two reticles for PLVR. This increase in reticles is offset in part by the decreased inspection cost. Die-to-die inspection is a less expensive, faster method than die-to-database. Cost of reticle defect inspection contributes a significant amount to the overall reticle manufacturing cost.

Figure 11:
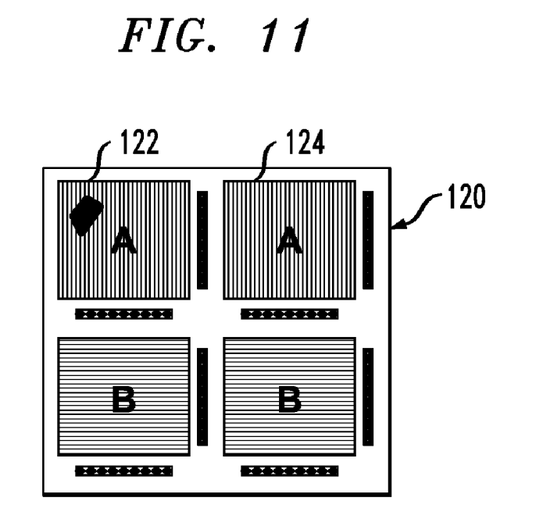
FIG. 11 illustrates a PLVR reticle having a defect in its first region (i.e., region A)
Figure 12:
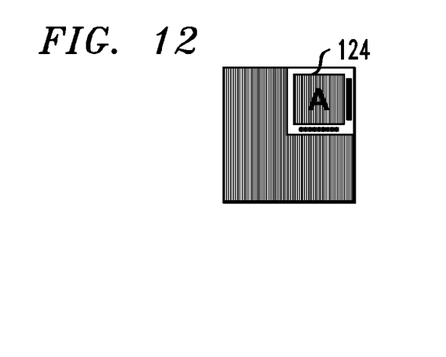
FIG. 12 illustrates how the defective region can be bladed off to avoid yield impact.
Figure 13:
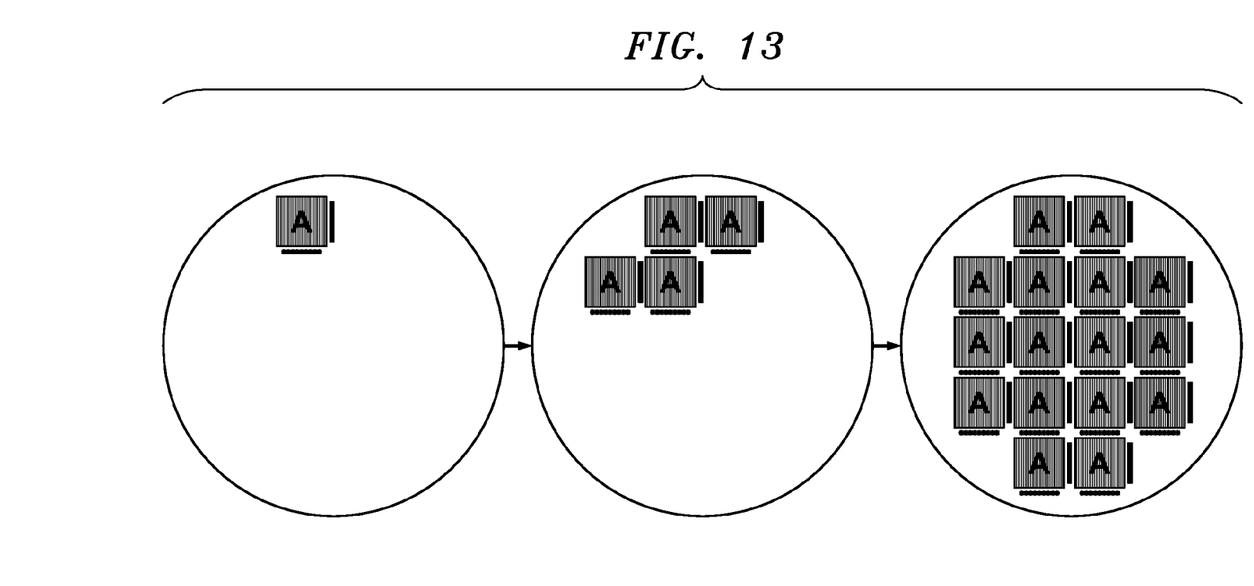
FIG. 13 illustrates how the defect does not impact yield (i.e., 0 yield impact).

As discussed above, a layout such as shown in FIG. 9 provides that one has the option of which die to use for device manufacturing. This will now be further explained using a specific example. In the example shown in FIG. 11, a defect 120 occurs on one die of layer A (identified with reference numeral 122 in FIG. 11). Since there are two instances of the die (i.e., two region A's), only one is needed for manufacturing. As shown in FIG. 12, the bad die can be bladed out with the stepper file 123, and only the upper right die 124 (i.e., the second instance of region A) used for exposure (see FIG. 13). The reticle, which would have been rejected at the mask shop if the reticle were a conventional LVR reticle having one instance of layer A, one instance of layer B, etc., is still fit for production use. While the defect may not be such that it would render the device defective, the defect could represent poor critical dimension (CD) uniformity or line edge roughness. In either case, the superior die on the reticle (i.e., the better of the two die) may be chosen for manufacturing purposes.

By including two instances of each layer, the total number of reticles in a PLVR set is greater than standard LVR but less than traditional HVR. For low volume manufacturing, the PLVR method is superior to HVR because fewer reticles need to be purchased to print a design on a wafer. The trade off for more total reticles in the PLVR set than standard LVR is the ability to perform die-to-die inspection on each reticle and have resilience to defects added in the manufacturing or production process. This method also works with mixed reticle sets of LVR and HVR reticles for the production of Gate Array, Embedded Array, and RapidChip® products.

While an embodiment of the present invention is shown and described, it is envisioned that those skilled in the art may devise various modifications of the present invention without departing from the spirit and scope of the appended claims.

What is claimed is:

1. A method of using a reticle to expose die onto a wafer, said method comprising:

providing the reticle, wherein the reticle comprises a plurality of sets of mask patterns, wherein each set comprises a plurality of mask patterns, wherein each mask pattern in a set of mask patterns is identical to each other, but is different from the mask patterns in the other at least one set of mask patterns; and blading off at least one of the mask patterns on the reticle while using the reticle to expose at least one other mask pattern onto the wafer.

2. A method as recited in claim 1, further comprising providing that the reticle comprises a first set of a plurality of mask patterns, wherein each mask pattern in the first set is identical to each other, and comprising a second set of a plurality of mask patterns, wherein each mask pattern in the second set is identical to each other, wherein each mask pattern in the first set is different than each mask pattern in the second set, and each mask pattern in the second set is different than each mask pattern in the first set.

3. A method as recited in claim 1, further comprising providing that the reticle includes two instances of each of the mask patterns.

4. A method as recited in claim 1, further comprising providing that the reticle includes a vertical scribe and a horizontal scribe proximate at least one of the mask patterns.

5. A method as recited in claim 1, further comprising providing that the reticle includes a vertical scribe and a horizontal scribe proximate each of the mask patterns.

6. A method of using a reticle to expose die onto a wafer, said method comprising:
providing the reticle, wherein the reticle comprises a plurality of sets of mask patterns, wherein each set comprises a plurality of mask patterns, wherein each mask pattern in a set of mask patterns is identical to each other, but is different from the mask patterns in the other at least one set of mask patterns;
determining whether there is a defective mask pattern on the reticle, and blading off the defective mask pattern on the reticle while using the reticle to expose at least one other non-defective mask pattern onto the wafer.

7. A method as recited in claim 6, further comprising providing that the reticle comprises a first set of a plurality of mask patterns, wherein each mask pattern in the first set is identical to each other, and comprising a second set of a plurality of mask patterns, wherein each mask pattern in the second set is identical to each other, wherein each mask pattern in the first set is different than each mask pattern in the second set, and each mask pattern in the second set is different than each mask pattern in the first set.

8. A method as recited in claim 6, further comprising providing that the reticle includes two instances of each of the mask patterns.

9. A method as recited in claim 6, further comprising providing that the reticle includes a vertical scribe and a horizontal scribe proximate at least one of the mask patterns.

10. A method as recited in claim 6, further comprising providing that the reticle includes a vertical scribe and a horizontal scribe proximate each of the mask patterns.

* * * * *